United States Patent [19]

Harada et al.

[11] Patent Number: 5,179,070
[45] Date of Patent: Jan. 12, 1993

[54] SEMICONDUCTOR SUBSTRATE HAVING A SUPERCONDUCTING THIN FILM WITH A BUFFER LAYER IN BETWEEN

[75] Inventors: Keizo Harada; Hideo Itozaki; Naoji Fujimori; Shuji Yazu; Tetsuji Jodai, all of Itami, Japan

[73] Assignee: Sumitomo Electric Industries, Ltd., Japan

[21] Appl. No.: 726,124

[22] Filed: Jul. 2, 1991

Related U.S. Application Data

[63] Continuation of Ser. No. 345,835, May 1, 1989, abandoned.

[30] Foreign Application Priority Data

| Apr. 30, 1988 | [JP] | Japan | 63-108498 |
| May 2, 1988 | [JP] | Japan | 63-109323 |
| May 2, 1988 | [JP] | Japan | 63-109324 |
| May 6, 1988 | [JP] | Japan | 63-110011 |
| May 6, 1988 | [JP] | Japan | 63-110012 |
| May 6, 1988 | [JP] | Japan | 63-110013 |
| May 6, 1988 | [JP] | Japan | 63-110014 |
| May 6, 1988 | [JP] | Japan | 63-110015 |
| May 6, 1988 | [JP] | Japan | 63-110016 |
| May 6, 1988 | [JP] | Japan | 63-110017 |
| May 6, 1988 | [JP] | Japan | 63-110018 |
| May 6, 1988 | [JP] | Japan | 63-110019 |
| May 6, 1988 | [JP] | Japan | 63-110020 |
| May 6, 1988 | [JP] | Japan | 63-110021 |
| May 6, 1988 | [JP] | Japan | 63-110022 |
| May 6, 1988 | [JP] | Japan | 63-110023 |
| May 6, 1988 | [JP] | Japan | 63-110024 |
| May 6, 1988 | [JP] | Japan | 63-110025 |
| Oct. 3, 1988 | [JP] | Japan | 63-249425 |

[51] Int. Cl.[5] .................. H01B 12/00; H01L 39/22; B05D 5/12
[52] U.S. Cl. .................. 505/1; 427/62; 427/63; 257/33; 257/35
[58] Field of Search ............... 357/5; 505/1, 704, 729, 505/781, 833; 427/62, 63

[56] References Cited

U.S. PATENT DOCUMENTS

| 4,053,804 | 10/1977 | Aboelfotoh | 315/169.4 |
| 4,297,613 | 10/1981 | Aboelfotoh | 315/58 |
| 4,395,813 | 8/1983 | Roth et al. | 427/62 |
| 4,531,982 | 7/1985 | Dubots | 505/920 |
| 4,882,312 | 11/1989 | Mogro-Campero et al. | 427/62 |

FOREIGN PATENT DOCUMENTS

1-107419  4/1989  Japan ................ 427/62

OTHER PUBLICATIONS

"Preparation of y $Ba_2 Cu_3 O_{7-x}$ Superconducting Thin Films by RF Magnetron Sputtring", Aida et al., Japanese Journal of Applied Physics, vol. 26, #9, Sep. 1987, pp. L1489–L1491.

"Microprobe Characterization of Sputtered High-7C Superconducting Films on Si and SiT103", LEE et al., American Vacuum Society, 34th National Symposium Final Report, Nov. 1987, Abstracts, p. 266.

"Effect of Noble Metal Buffer Layer on Superconducting y Ba $Cu_3O_7$ Thin Films", Chien et al., Appl. Phys. Lett., vol. 51, #25, 21 Dec. 1987, pp. 2155–2157.

"A New High 7c Oxide Superconductor without a Rare Earth Element", Maeda et al., Jap. J. Appl. Phys., vol. 27, 190 2, Feb. 1988, pp. L209–L210.

(List continued on next page.)

Primary Examiner—Rolf Hille
Assistant Examiner—Mahshid Saadat
Attorney, Agent, or Firm—Jordan B. Bierman

[57] ABSTRACT

A semiconductor substrate such as silicon single crystal having a thin film of a superconducting material composed of a compound oxide whose critical temperature is higher than 30 K such as $Ln_1Ba_2Cu_3O_{7-\delta}$ (Ln is Y or lanthanide), characterized in that a buffer layer composed of $ZrO_2$, MgO containing or not containing metal element such as Ag is interposed between the semiconductor substrate and the superconducting thin film.

6 Claims, 3 Drawing Sheets

OTHER PUBLICATIONS

Applied Physics Letters, vol. 51, No. 25; Dec. 21, 1987, "Superconducting & Structural Properties of Thin Films of $YBa_2Cu_3O_{7-x}$".

Japanese Journal of Applied Physics, vol. 27, No. 2; Feb. 2, 1988, "A New High-Tc Oxide Superconductor without a Rare Earth Element".

Applied Physics Letters, vol. 51, No. 13; Sep. 28, 1987, "Preparation and Substrate Reactions of Superconducting Y-Ba-Cu-O Films".

Applied Physics Letters, vol. 52, No. 14; Apr. 4, 1988, "Thin Films of Y-Ba-Cu-O on Silicon and Silicon Dioxide".

Comptes Rendus de l'Academie des Sciences, vol. 306, No. 12, Mar. 28, 1988, "Preparation de Couches Minces Superconductrices a Haute Temperature critique sur Substrat de Silicium".

Electronics Letters, vol. 24, No. 6, DC Magnetron Sputtering of Y-Ba-Cu-O on Si (100).

SEMICONDUCTOR SUBSTRATE HAVING A SUPERCONDUCTING THIN FILM WITH A BUFFER LAYER IN BETWEEN

This application is a continuation of application Ser. No. 07/345,835, filed May 1, 1989, now abandoned.

BACKGROUND OF THE INVENTION

1. Field of the Invention

The present invention relates to a semiconductor substrate having a superconducting thin film thereon and a process for producing the same.

More particularly, it relates to a single crystal semiconductor substrate having a superconducting thin film which is uniform in composition and possesses a high critical temperature (Tc) and a high critical current density (Jc) and a process for producing the same.

The superconducting thin film layer deposited on the semiconductor substrate according to the present invention can be used as a wiring material for integrated circuits which are built in the semiconductor substrate and for Josephson junctions in Josephson devices.

The semiconductor substrate according to the present invention can be used as a material for fabricating a novel circuit element which utilizes "an aproximity A proximity effect" between a semiconductor and a superconductor such as a superconducting transistor or a hot-electron transistor.

2. Description of the Related Art

The superconductivity is a phenomenon which is explained to be a kind of phase change of electrons under which the electric resistance becomes zero and perfect diamagnetism is observed. Several superconducting devices have been proposed and developed in electronics which is a typical field to which the superconducting phenomenon is applicable.

A typical application of the superconductor is a Josephson device in which quantum efficiency is observed macroscopically when an electric current is passed through a weak junction arranged between two superconductors. The tunnel junction type Josephson device is expected to be a high-speed and low-power consuming switching device owing to the smaller energy gap of superconducting material. It is also expected to utilize the Josephson device as a high-sensitive sensor or detector for sensing very weak magnetic field, microwave, radiant ray or the like since variation of electromagnetic wave or magnetic field is reflected in variation of Josephson effect and can be observed as a precise quantum phenomenon.

Development of the superconducting devices such as high-speed logic units or no power-loss wiring materials is also demanded in the field of high-speed computers in which the power consumption per unit area is reaching the upper limit of the cooling capacity with increment of the integration density in order to reduce energy consumption. In fact, one of the basic technologies for fabricating an integrated circuit on a silicon single crystal substrate is a metallization technology for forming patterned conductor lines which are used for interconnecting a variety of electronic elements which are fabricated by other basic technology including an insulating layer forming stage, a patterning stage of the insulating layer and an impurity doping stage by means of thermal diffusion, ion implantation or the like. However, a part of the signal current passing through the conventional metallic conductor lines is lost because the cross sectional area of the metallic wiring line is very fine in the case of integrated circuits which are built on silicon substrates. Therefore, it is necessary to deliver the signal current without current loss by means of a superconductor.

The critical temperature "Tc" of superconductivity, however, did not exceed the 23.2K of $Nb_3Ge$ which was the highest Tc for the past ten years, so that such materials have not been used as wiring material for ICs.

The possibility of an existence of a new type of superconducting material having much higher Tc was revealed by Bednorz and Müller, who discovered a new oxide type superconductor in 1986 (Z. Phys. B64, 1986 p189).

It had been known that certain ceramic materials of compound oxides exhibit the property of superconductivity. For example, U.S. Pat. No. 3,932,315 discloses Ba-Pb-Bi type compound oxide which shows superconductivity and Japanese patent laid-open No. 60-173,885 discloses that Ba-Bi-Pb type compound oxides also show superconductivity. These superconductors, however, possess rather lower transition temperatures of about 10K and hence usage of liquidized helium (boiling point of 4.2K) as cryogen is indispensable to realize superconductivity.

The new type compound oxide superconductor discovered by Bednorz and Müller is represented by [La, $Sr]_2CuO_4$ which is called the $K_2NiF_4$-type oxide having a crystal structure which is similar to known perovskite type oxides. The $K_2NiF_4$-type compound oxides show such higher as 30K which are extremely higher than known superconducting materials.

It was also reported that C. W. Chu et al. discovered, in the United States of America, another superconducting material so called YBCO type represented by $YBa_2Cu_3O_{7-x}$ having the critical temperature of about 90K in February 1987 (Physical Review letters, Vol. 58, No. 9, p908).

The other type new superconducting materials which were reported recently are a compound oxide of Bi-Sr-Ca-Cu-O system reported by Maeda et al (Japanese journal of Applied Physics. Vol. 27, No. 2, p 1209 to 1210) and Tl-Ba-Ca-Cu-O system which exhibit such high Tc as more than 100K (Hermann et al. Appl. Phys. Lett. 52 (20) p1738) and which are chemically much stable than the abovementioned YBCO type compound oxide or the like. And hence, the possibility of an actual utilization of the high Tc superconductors has burst onto the scene.

The above-mentioned new type superconducting materials can be deposited on a substrate in a form of a thin film by physical vapour deposition (PVD) technique or chemical vapor deposition (CVD) technique.

In the conventional process for preparing such thin film of superconductors on substrates, a vapour source or a target of an oxide which is prepared by sintering technique is vaporized or sputtered to deposit a thin film of superconductor which is then subjected to an after-treatment in which the thin film deposited is heated or annealed in an oxygen-containing atmosphere or which is exposed to oxygen plasma. Such after-treatment is indispensable to realize the desired superconducting properties because the superconducting properties of the above-mentioned new type compound oxide superconductors are influenced by the oxygen deficiency in the crystal. In fact, if the oxygen deficiency in the crystal is not proper, Tc can not become higher and the discrepancy between the onset temperature and a temperature where perfect zero resistance is observed becomes large.

The conventional sputtering technique for preparing a thin film composed of the ceramics type oxide superconductors represented by the formula $BaPb_{1-x}Bi_xO_3$ (in which $0.05 \leq x \leq 0.35$) is disclosed in Japanese patent laid-open No. 56-10,9824. In this patent, the superconducting thin film which is represented in an oxygen-containing atmosphere by high-frequency sputtering technique while the substrate is heated in order to improve ordering or orientation of the crystal. The resulting film deposited on the substrate is further heat-treated at 500° to 550° C. in order to increase the oxygen-content in the thin film but the reference mentions nothing about the conditions required how to prepare the thin film of high-Tc superconductor which discovered after the filing date of this patent.

Still more, the substrates on which the thin films of the new type superconductors are deposited are limited to very special materials such as single crystal oxides of $MgO$, $SrTiO_3$ or the like because the substrates are required to have the same or similar lattice constants as the superconducting thin film to be deposited in order to realize desired crystalline structures of superconductors. Since the single crystal oxides such as MgO or $SrTiO_3$ possess similar lattice constants to the new type superconductor and are chemically stable, they have been usually used as the substrate. However, they are not semiconductors but insulators.

In order to realize the above-mentioned new type circuit element which utilizes "an A proximity effect" between a semiconductor and a superconductor such as a superconducting transistor or a hot-electron transistor, it is requested to deposit the thin film of superconductor on the semiconductor, particularly on a silicon single crystal which is predominantly used in the IC industry. An idea of such new devices such as a superconducting transistor or a hot electron transistor have been proposed (M. Heiblum et al. "Solid State Electronics" Vol. 24, No. 343-346, 1981) but have not yet realized as an actual device by utilizing the oxide type superconductors. In order to realize the superconducting transistor, hot electron transistor or FET, it is indispensable to prepare such a semiconductor substrate that has a superconducting layer deposited homogeneously thereon. The conventional metal type superconductors such as $Nb_3Ge$ are difficult to be deposited uniformly on the semiconductor and have very lower critical temperatures.

It is proposed to replace the insulator substrates such as MgO or $SrTiO_3$ by a semiconductor substrate so that a superconducting thin film is deposited directly on the semiconductor substate by the conventional sputtering technique. In this case, however, it is very difficult to produce reproductively the superconducting thin film having desired quality.

The reasons that a homogeneous superconducting layer can not be formed on a semiconductor substrate are thought as follow:

Firstly, the substrate on which the superconducting thin film is deposited must be heated at a high temperature of about 700° C. during the sputtering operation. Therefore, when a semiconductor substrate such as a silicon substrate is used, an element of the substrate such as silicon diffuses into the superconducting thin film layer, resulting in deterioration of superconducting property. Secondly, the desired crystalline structure of superconductor can not be realized in the thin film because of mismatch of lattice constants between the superconductor and the semiconductor. Finally, fine cracks are produced in the superconducting thin film deposited because of the difference in thermal expansion coefficients between the superconductor and the semiconductor.

The present applicant already proposed several processes for preparing the thin films of the high-Tc superconductor on oxide substrate in the following patent applications: U.S. patent application Ser. No. 152,714 filed on Feb. 2, 1988, U.S. patent application Ser. No. 167,895 filed on Mar. 13, 1988, U.S. patent application Ser. No. 195,145 filed on May 18, 1988, U.S. patent application Ser. No. 195,147 filed on May 18, 1988, U.S. patent application Ser. No. 200,206 filed on May 31, 1988, U.S. patent application Ser. No. 286,860 filed on Dec. 20, 1988, U.S. patent application Ser. No. 289,718 filed on Dec. 25, 1988, U.S. patent application Ser. No. 289,719 filed on Dec. 25, 1988, U.S. patent application Ser. No. 290,309 filed on Dec. 26, 1988 or the like. The present invention is completed on the same line of these patent applications.

An object of the present invention is to provide a semiconductor substrate having a superconducting thin film thereon and a process for producing the same.

SUMMARY OF THE INVENTION

The present invention provides a semiconductor substrate having a thin film of a superconducting material composed of a compound oxide whose critical temperature is higher than 30K, characterized in that the superconducting thin film is formed on a buffer layer which is deposited on a surface of the semiconductor substrate.

The semiconductor substrates to which the present invention is applicable are preferably silicon (Si) single crystal and gallium arsenic (GaAs) single crystal which are actually used as substrates for integrated circuits. The present invention is also applicable to the other compound semiconductor substrates such as GaP, InP, ZnSe, InSb, 3C-SiC, 6H-SiC, InAlAs, GaInAs, InGaAsP, HgCdTe, GaAlAs and CdTe which are in the development stage. In a special application, the substrate can be a diamond substrate. Preferably, the buffer layer is deposited on {100} plane of a silicon single crystal substrate.

The essence of the present invention reside in that a buffer layer is interposed between the semiconductor substrate and the superconductor thin film layer. The buffer layer has preferably a thickness of more than 50 Å, more preferably in a range of 50 to 1,000 Å. Diffusion of silicon element into the superconducting thin film layer can be prevented effectively by the buffer layer of more than 50 Å so that an improved superconducting thin film layer is produced.

According to a preferred embodiment, the buffer layer is made of $ZrO_2$ or MgO which has one of the following structures:

(i) a buffer layer of $ZrO_2$ or MgO is amorphous, (ii) a buffer layer of $ZrO_2$ having a tetragonal system and has a crystalline orientation which expose {100} plane to its surface or a single crystal having a {100} plane on its surface, (iii) a buffer layer of $ZrO_2$ having a cubic system and has a crystalline orientation which expose {100} plane to its surface or a single crystal having a {100} plane on its surface, (iv) a buffer layer of MgO having a cubic system and has a crystalline orientation which expose {100} plane to its surface or a single crystal having a {100} plane on its surface, and (v) a buffer layer of MgO having a cubic system and has a crystalline orientation which expose {111} plane to its surface or a single crystal having a {111} plane on its surface.

When a buffer layer of ZrO$_2$ or MgO which is not amorphous is used as the substrate, the superconducting thin film layer deposited shows a c-axis oriented crystalline structure or becomes a single crystal. The term c-axis oriented crystalline structure includes any crystal whose c-axis is inclined at a certain angle with respect to a surface of the thin film in addition to a crystal whose c-axis is perpendicular thereto.

The buffer layer interposed between the superconducting thin film and the semiconductor substrate according to the present invention prevents mutual diffusion between elements of the superconductor and the semiconductor, so that a thin film of superconductor of compound oxide having high Tc can be deposited on the semiconductor.

However, it is often observed that fine micro cracks caused by difference in thermal expansion coefficient are produced in the superconducting thin film. Such cracks deteriorate continuity of the superconducting thin film and result in lowering its critical current density (Jc). Therefore, it is necessary to absorb the difference in the thermal expansion.

According to another embodiment which is provided by the second aspect of the present invention, the buffer layer is a composite layer consisting of at least one metal and at least one oxide. The buffer layer permits the production of a thin film layer of superconducting composite layer of high quality which has no micro cracks. The metal element preferably has a fine crystalline structure which is evenly distributed in a crystalline structure of the oxide. Preferably, the metal element exists in a constant relation with respect to the crystalline structure of the oxide. Preferably, the oxide and the metal of which the composite layer is composed have similar lattice constants and are little diffused into the superconducting composite oxide thin film layer. The compound layer is preferably composed of an oxide selected from ZrO$_2$, MgO or yttrium stabilized zirconia (YSZ) and a metal selected from Ag or Au.

When the buffer layer is interposed between the semiconductor substrate and the superconducting thin film layer, the condition of the interface between them is much improved over the first embodiment in which the buffer layer is made of oxide only so that the properties of the semiconductor are also improved. In this case, much higher critical current density (Jc) can be passed through the superconducting thin film layer deposited because the thin film shows a c-axis oriented crystalline structure or becomes a single crystal and also because the thin film has no micro cracks. The composite layer as a buffer layer may be produced by a physical vapour deposition technique such as molecular beam epitaxy (MBE).

The superconducting thin film having a composition of Y$_1$Ba$_2$Cu$_3$O$_7$ formed on the buffer layer deposited on the semiconductor according to the present invention has a X-ray diffraction pattern which is characterized by the following:

(1) a ratio $I_z/I_{100}$ (in which $I_{100}$ and $I_z$ are respective intensities of the most intensive reflection peak and of a reflection peak of {00n} plane (n is an integer) observed in a X-ray diffraction pattern for a sintered powder having the same composition as the thin film according to the present invention) has the following relation with respect to a ratio $J_w/J_{100}$ (in which $J_{100}$ and $J_w$ are respective intensities of a plane which has the same index as the above-mentioned most intensive reflection peak and of a reflection peak of {00n} plane (n is an integer) observed in a X-ray diffraction pattern for the thin film according to the present invention):

$$J_w/J_{100} \geq 2(I_z/I_{100})$$

(2) a ratio $I_2/I_{100}$ (in which $I_2$ is an intensity of {002} plane) has the following relation with respect to a ratio $J_2/J_{100}$ (in which $J_2$ is the intensity of a reflection peak of {002} plane observed in a X-ray diffraction pattern for the thin film according to the present invention):

$$J_2/J_{100} \geq 2(I_2/I_{100})$$

(3) a ratio $I_3/I_{100}$ (in which $I_3$ is an intensity of {003} plane) has the following relation with respect to a ratio $J_3/J_{100}$ (in which $J_3$ is a intensity of a reflection peak of {003} plane observed in a X-ray diffraction pattern for the thin film according to the present invention):

$$J_3/J_{100} \geq 2(I_3/I_{100})$$

(4) a ratio $I_5/I_{100}$ (in which $I_5$ is an intensity of {005} plane) has the following relation with respect to a ratio $J_5/J_{100}$ (in which $J_5$ is an intensities of a reflection peak of {005} plane observed in a X-ray diffraction pattern for the thin film according to the present invention):

$$J_5/J_{100} \geq 2(I_5/I_{100})$$

(5) in the X-ray diffraction pattern of the thin film according to the present invention, the peaks of {002} plane, {003} plane and {005} plane have intensities of more than two times of the peaks of {111} plane and {112} plane.

Namely, the superconducting compound oxide of Ba, Y and Cu has preferably a X-ray diffraction pattern shown in FIG. 1.

The superconducting thin film layer which can be deposited on the semiconductor substrate through the buffer layer according to the present invention can be made of any one of compound oxide type superconducting materials having the critical temperature of higher than 30K including the following known compound oxides:

(1) compound oxides having a perovskite type or oxygen deficient perovskite type crystalline structure and represented by the general formula:

$$(\alpha_{1-x}\beta_x)_\gamma\gamma_yO_z$$

in which $\alpha$ stands for an element selected from IIa group of the Periodic Table, $\beta$ stands for an element selected from IIIa group of the Periodic Table, $\gamma$ stands for an element selected from a group comprising Ib, IIb, IIIb, IVa and VIIIa groups of the Periodic Table, x is an atomic ratio of $\beta$ with respect to $(\alpha+\beta)$ and has a range of $0.1 \leq x \leq 0.9$, and y and z are respective atomic ratios with respect to $(\alpha_{1-x}\beta_x)$ which is considered to be equal to 1 and each satisfies ranges of $0.4 \leq y \leq 3.0$ and $1 \leq z \leq 5$ respectively.

The element $\alpha$ of IIa group element is preferably Ba, Sr, Ca, Mg, Be or the like. More preferably the element α is Ba and Sr from 10% to 80% of which may be replaced by one or two elements selected from a group comprising Mg an Ca. The element β of IIIa group element is preferably Sc, Y, La and lanthanide elements such as Ce, Gd, Ho, Er, Tm, Yb or Lu. More preferably the element β is Y, La or Ho from 10% to 80% of which may be replaced by Sc or one or two elements selected from the other lanthanide elements. The γ is usually copper a part of which can be replaced by the other element selected from a group comprising Ib, IIb, IIIb, IVa and VIIIa groups of the Periodic Table such as Ti or V. These systems are thought to have quasi-perovskite type crystal structure such as oxygen deficient orthorombic crystal structure or the like. More particularly, they can be the following compound oxides:

(1-1) a compound oxide represented by the general formula:

$$(La_{1-x}Sr_x)_2CuO_{4-a}$$

in which, $0 < x < 1$ and $0 < a < 1$.

(1-2) a compound oxide of Ba, Ln (Ln stands for an element selected from Y, La or lanthanide elements) and Cu and represented by the general formula:

$$Ln_1Ba_2Cu_3O_{7-\delta}$$

in which Ln stands for Y or at least one lanthanide element selected from a group comprising La, Nd, Sm, Eu, Gd, Dy, Ho, Er, Yb, Tm and Lu and δ is a number which satisfies a range of $0 \leq \delta < 1$. Namely, this type compound oxides include following systems: $Y_1Ba_2Cu_3O_{7-\delta}$, $Ho_1Ba_2Cu_3O_{7-\delta}$, $Lu_1Ba_2Cu_3O_{7-\delta}$, $Sm_1Ba_2Cu_3O_{7-\delta}$, $Nd_1Ba_2Cu_3O_{7-\delta}$, $Gd_1Ba_2Cu_3O_{7-\delta}$, $Eu_1Ba_2Cu_3O_{7-\delta}$, $Er_1Ba_2Cu_3O_{7-\delta}$, $Dy_1Ba_2Cu_3O_{7-\delta}$, $Tm_1Ba_2Cu_3O_{7-\delta}$, $Yb_1Ba_2Cu_3O_{7-\delta}$, $La_1Ba_2Cu_3O_{7-\delta}$ in which δ is a number which satisfies a range of $0 < \delta < 1$ and possess preferably perovskite type or quasi-perovskite type crystal structure. The term quasi-perovskite type means a structure which can be considered to have such a crystal structure that is similar to perovskite-type oxides and includes an orthorhombically distorted perovskite or a distorted oxygen-deficient perovskite or the like.

An atomic ratio of the lanthanide element "Ln":Ba:Cu is preferably 1:2:3 as is defined by the formula but the atomic ratio is not restricted strictly to this ratio. In fact, the other compound oxides having different atomic ratios which are deviate from the above-mentioned values by 10% may exhibit superconducting property.

(2) the compound oxide is represented by the general formula:

$$\Theta_4(\Phi_{1-q}, Ca_q)_mCu_nO_{p+r}$$

in which Θ stands for Bi or Tl, Φ stands for Sr when Θ is Bi and stands for Ba when Θ is Tl, m and n are numbers each satifying ranges of $6 \leq m \leq 10$ and $4 \leq n \leq 8$ respectively, $p=(12+2m+2n)/2$, q is a number which satisfies a range of $0 < q < 1$, and r is a number which satisfies a range of $-2 \leq r \leq +2$. Namely, this type compound oxides include the following systems: $Bi_4Sr_4Ca_4Cu_6O_{20-r}$, $Bi_2Sr_2Ca_2Cu_3O_{10-r}$, $Tl_4Ba_4Ca_4Cu_6O_{20-r}$, $Tl_2Ba_2Ca_2Cu_3O_{10-r}$, in which r is a number which satisfies a range of $-2 \leq r \leq +2$.

The present invention is applicable to the other compound oxides.

When electronic systems or semiconductor devices are fabricated in the semiconductor substrate according to the present invention, the superconducting thin film layer can be removed locally by etching technique or the like so that the superconducting thin film layer is shaped into a desired circuit pattern. The superconducting thin film layer deposited on the semiconductor substrate according to the present invention can be used as a wiring material for semiconductor circuits which are built in the substrate or as an element of a superconducting transistor. The semiconductor substrate according to the present invention can be used also as a substrate for fabricating an integrated circuit for building novel superconducting elements or as a substrate on which electronic devices are built. For example, Josephson junctions can be fabricated in the superconducting thin film to built Josephson devices. The semiconductor substrate according to the present invention can be used also for fabricating high-speed semiconductor devices such as superconducting transistors havign more than three electrodes, superconducting FETs or hot electron transistors which utilized the interface between the superconducting thin film layer and the semiconductor substrate.

The present invention provides also a process for producing the above-mentioned semiconductor substrate having the thin film layer of superconducting compound oxide.

The process according to the present invention comprises two steps of depositing a buffer layer on a surface of a semiconductor substrate and then depositing a superconducting thin film composed of a compound oxide whose critical temperature is higher than 30K.

The two steps can be carried out by physical vapor deposition technique (PVD) such as sputtering, ion-plating, molecular beam epitaxy (MBE) or chemical vapor deposition (CVD) such as thermal CVD, plasma CVD, photo CVD, MOCVD or the like.

The first step for producing the buffer layer can be effected by any one of known PVD and CVD techniques which are selected according to the kinds of semiconductor substrate, while the second step for producing the superconducting layer is preferably effected by PVD, preferably sputtering, more particularly high-frequency magnetron sputtering technique. The superconducting thin film produced by the high-frequency magnetron sputtering technique possesses a superior crystalline structure and shows improved oxygen deficiency.

The superconducting thin film must be produced in oxygen-containing atmosphere in order to control the oxygen deficiency in the thin film deposited because the superconducting properties are influenced by the oxygen deficiency in the thin film.

Now, an example of the process according to the present invention, particularly the second step for producing the superconducting thin film by high-frequency magnetron sputtering technique will be described in more details.

DESCRIPTION OF PREFERRED EMBODIMENTS

Figure 1:
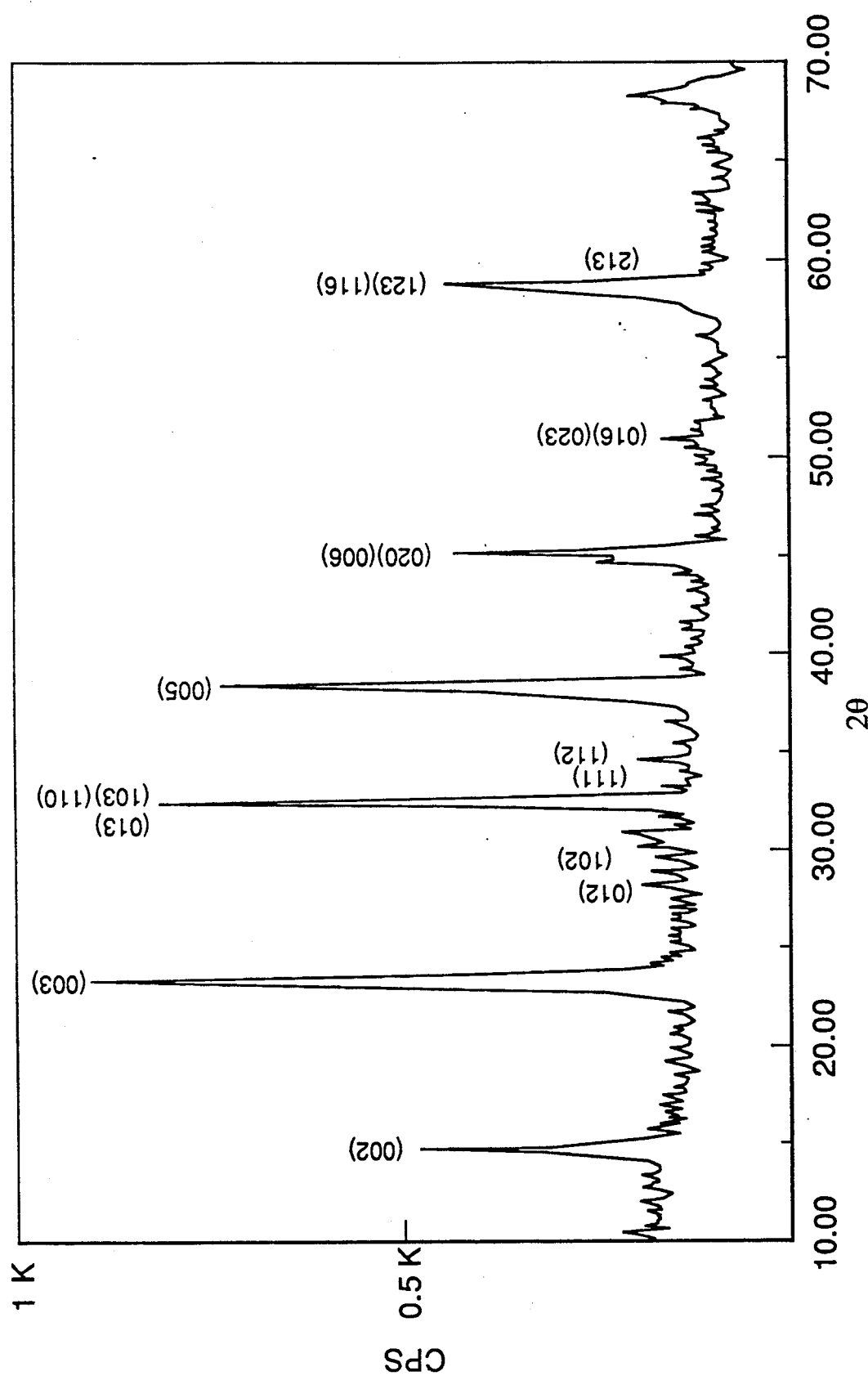
FIG. 1 is an X-ray diffraction chart observed in a superconducting thin film of $Y_1Ba_2Cu_3O_{7-x}$ deposited on a silicon single crystal substrate through a buffer layer of $ZrO_2$ prepared in Example 1 of the present invention.

In the second step for producing the superconducting thin film of compound oxide, the semiconductor substrate of single crystal is heated above 550° C. but below 750° C., the power density supplied to a target is selected between 1 W/cm² and 6 W/cm² and a distance from the target to the semiconductor substrate is selected between 20 mm and 40 mm.

If the substrate temperature exceeds 750° C., the physical properties of the semiconductor single crystal are spoiled and also a reaction occur between the semiconductor material and the compound oxide of which the superconducting thin film is composed. To the contrary, if the substrate temperature is not higher than 550° C., the crystalline compound oxide of superconductor can not be obtained so that it is impossible or difficult to prepare a thin film having desired superconducting properties. When the power density supplied to a target exceeds 6 W/cm² and when the distance from the target to the semiconductor substrate is not longer than 20 mm, uniformity of the thin film deposited is lost and hence the critical current density (Jc) become lower. To the contrary, when the power density supplied to a target is not higher than 1 W/cm² and when the distance from the target to the semiconductor substrate exceeds 40 mm, the deposition rate of the superconducting thin film becomes too slow and c-axis orientation becomes poor.

The composition of the target used in the second step for producing the superconducting thin film can be determined by persons skilled in the art by experiments and can be selected according to sputtering rates of vaporized elements, dimensions of a sputtering chamber or the like. For example, when a superconducting thin film of $Y_1Ba_2Cu_3O_{7-\delta}$ is produced, the composition of the target can be adjusted to $Y_1Ba_xCu_yO_z$ in which $2 \leq x \leq 2.4$, $4.2 \leq y \leq 5.5$ and $7 \leq x \leq 10$.

The sputtering gas is preferably a mixed gas of Ar and $O_2$ containing $O_2$ gas of 10 to 50%. When the $O_2$ is not higher than 10%, satisfactory oxygen can not be supplied. When the $O_2$ exceed 50%, the sputtering rate becomes too slow and is not practical.

In the conventional process, a post-annealing or heat-treatment after deposition was indispensable in order to obtain a superconducting thin film of high quality. According to the present process, however, it can omit or shorten the after-treatment in oxygen gas at a high temperature because the thin film as grown is a layer of a high quality. In fact, according to the present invention, the post-annealing can be omitted by introducing $O_2$ gas into the sputtering chamber just after deposition.

The buffer layer of MgO is preferably deposited on a predetermined plane of the semiconductor substrate in order to obtain the superconducting thin film of high quality whose crystal structure is oriented to c-axis on the substrate "as grown". Selection of the crystal plane depends on the combination of the semiconductor and the buffer layer. In fact, the structure and the crystalline orientation of the buffer layer depend on the plane of the semiconductor as an under-layer. For example, in a case that a buffer layer of MgO is formed on a silicon single crystal semiconductor substrate, the buffer layer is preferably deposited on {100} plane of the silicon substrate in order to assure orientation of the crystalline structure of the superconducting thin film deposited. In fact, the superconducting thin films of the above-mentioned type compound oxides show anisotropy in the critical current density. Namely, the current passing along a direction which is in parallel with a plane defined by a-axis and b-axis of the crystal show a very high critical current density, while the current passing along the other directions is relatively lower. Therefore, in this case, the c-axis of the superconducting thin film become nearly perpendicular to a surface of a substrate, so that the critical current density is improved greatly. If the buffer layer is not interposed between the semiconductor substrate and the superconducting thin film, silicon atoms diffuse into the superconducting thin film, so that the thin film obtained shows deteriorated superconducting properties and possesses lower critical current density.

According to the present invention, since a buffer layer is interposed between the superconducting thin film layer and the semiconductor substrate, the condition of an interface between them is improved greatly comparing to the conventional ones owing to reduced discrepancy in thermal expansion coefficient so that the semiconductor devices which utilize the combination of the superconductor and the semiconductor can be realized. It is apparent from the description abovementioned that the thin films according to the present invention have higher Jc than conventional superconducting thin film and hence they can be utilized advantageously in a applications of thin film devices, such as Matisoo switching elements or Josephson device, Anacker memory device or Superconducting Quantum Interference Device (SQUID) as well as high-speed semiconductor devices combined with a superconductor and having more than three terminals such as a superconducting transistor or superconducting FET or the like.

Now, the present invention will be described with reference to examples, but the scope of the present invention should not be limited thereto.

EXAMPLE 1

A buffer layer of $Zr_2O$ having a thickness of 500 Å is deposited on a {100} plane of a single crystal of silicon substrate in a sputtering machine by using a target made of sintered mass of $Zr_2O$ under the following conditions:

Pressure (total): $2 \times 10^{-2}$ Torr
Sputtering gas: Ar+$O_2$ ($O_2$: 16%)
Substrate temperature: 700° C.

A target for producing a superconducting thin film is prepared as following: at first, $Y_2O_3$, BaO and CuO are weighted in such proportions as Cu/Y=4.7 and Ba/Y=2.15 and then sintered in air at 900° C. The resulting sintered mass is pulverized to prepare a powder target.

A superconducting thin film of Y-Ba-Cu-O type is deposited in a high-frequency magnetron sputtering machine by using the powder target on the buffer layer of $Zr_2O$ under the following conditions:

Pressure (total): $2 \times 10^{-2}$ Torr
Sputtering gas: Ar+$O_2$ ($O_2$:16%)
Substrate temperature: 720° C.

A resulting thin film obtained of 1,000 Å thick is heated in oxygen gas stream at 700° C. for 24 hours and then cooled slowly at a cooling rate of 3° C./min.

The resulting thin film is polycrystal whose c-axis is oriented to a surface of the substrate and have a composition of $YBa_2Cu_{4.5}O_{7-k}$ (K is a number satisfies $0 \leq k < 1$).

A sample (width is 1 mm) is cut to determine superconducting properties by four probe method. The results are as following:

Tc: 85K
Jc: 150,000 A/cm$^2$

The thin film is measured by a X-ray diffraction analyzer (Rigaku Denki Co., Ltd) with Kα of Cu to obtain a X-ray diffraction pattern of the thin film shown in FIG. 1.

Figure 2:
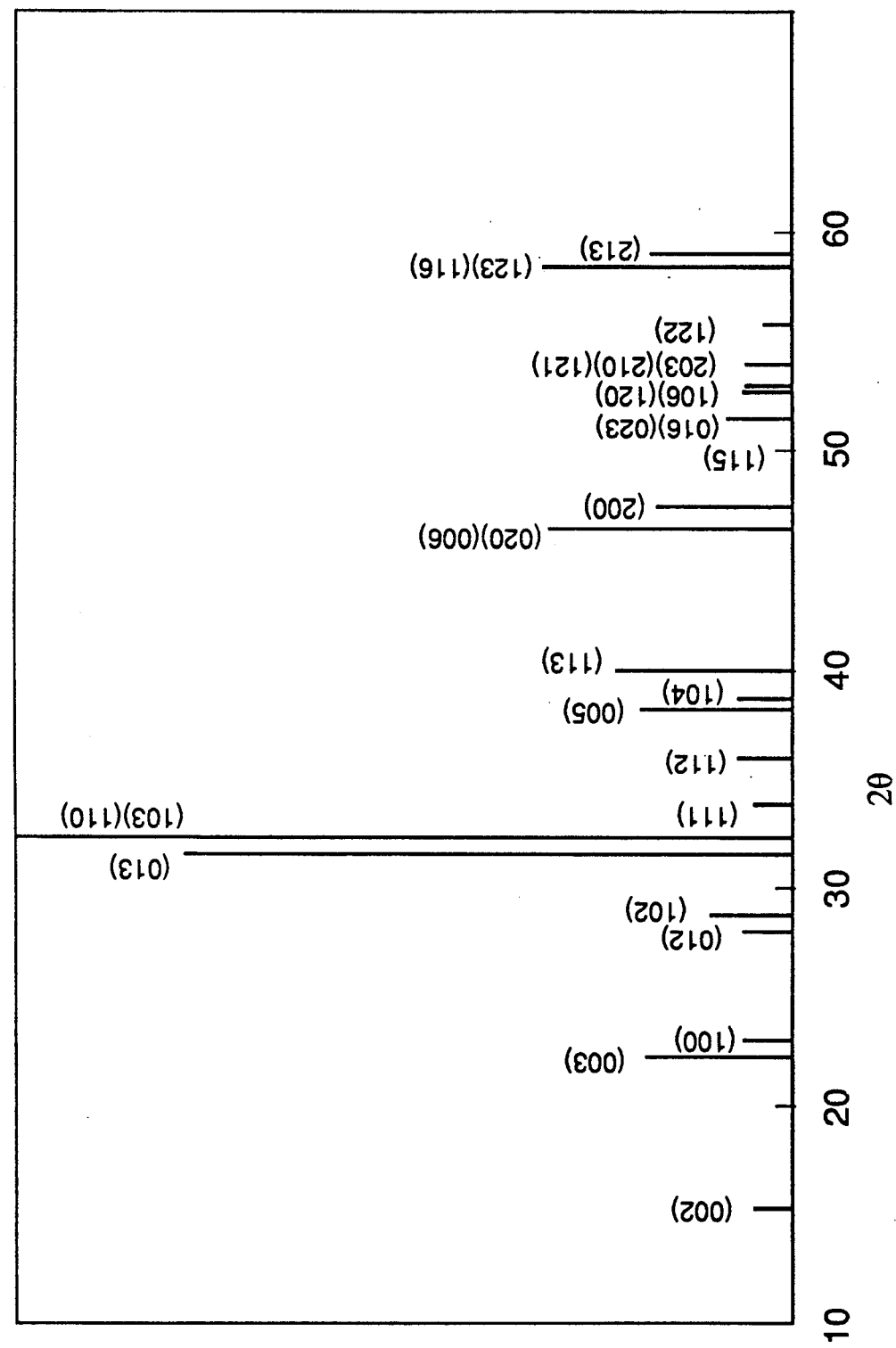
FIG. 2 is a known powder X-ray diffraction chart observed in a powder having a composition represented by $Y_1Ba_2Cu_3O_7$ which is used in Example 1 as a standard or a reference.

FIG. 2 is a powder X-ray diffraction chart observed in a known powder sample represented by $Y_1Ba_2Cu_3O_7$ which is used as a reference.

In the powder X-ray diffraction chart of FIG. 2, the most intensive peak is observed at a crystal face corresponding to the indexes of {103} plane and {110} plane.

At first, terms of $I_{100}$, $I_z$, $J_{100}$ and $J_w$ are defined as following:

$I_{100}$: an intensity of the most intense peak in the powder X-ray diffraction chart (FIG. 2) measured in the powder sample of Y1Ba2Cu3O7, $I_z$: an intensity of the (00n) plane in the powder X-ray diffraction chart, wherein n is an integer, $J_{100}$: an intensity of a crystal face which has the same index of the crystal face as the most intense peak in the powder X-ray diffraction chart (FIG. 2) and which is observed in a X-ray diffraction chart measured in the thin film of the present invention, $J_w$: an intensity of the (00n) plane in the X-ray diffraction chart measured in the thin film of the present invention.

From comparison FIG. 1 and FIG. 2, there exist such relations or ratios of intensities among them as are shown in Table 1.

TABLE 1

| Crystal plane | $I_z/I_{100}$ | $J_w/J_{100}$ | J/I | ratio to {100} | ratio to {112} |
|---|---|---|---|---|---|
| {002} | 0.027 | 0.469 | 17.4 | 9.4 | 3.8 |
| {003} | 0.137 | 1.113 | 8.1 | 22.3 | 8.9 |
| {005} | 0.136 | 0.900 | 6.6 | 18.0 | 7.2 |

Note:
J/I is a ratio of $(J_w/J_{100})/(I_z/I_{100})$

EXAMPLE 2

Several buffer layers of $Zr_2O$ having a variety of crystalline structures as is listed in Table 2 are deposited on a silicon substrate by sputtering:

TABLE 2

| Sample No | substrate temperature | crystalline condition | thickness (Å) |
|---|---|---|---|
| 1 | 200° C. | amorphous | 500 |
| 2 | 500° C. | tetragonal {100} oriented | 80 |
| 3 | 700° C. | cubic {100} single crystal | 300 |

RF power: 200 W
Pressure: $2 \times 10^{-2}$ Torr
Sputtering gas: Ar+O$_2$ (O$_2$: 20%)

Figure 3:
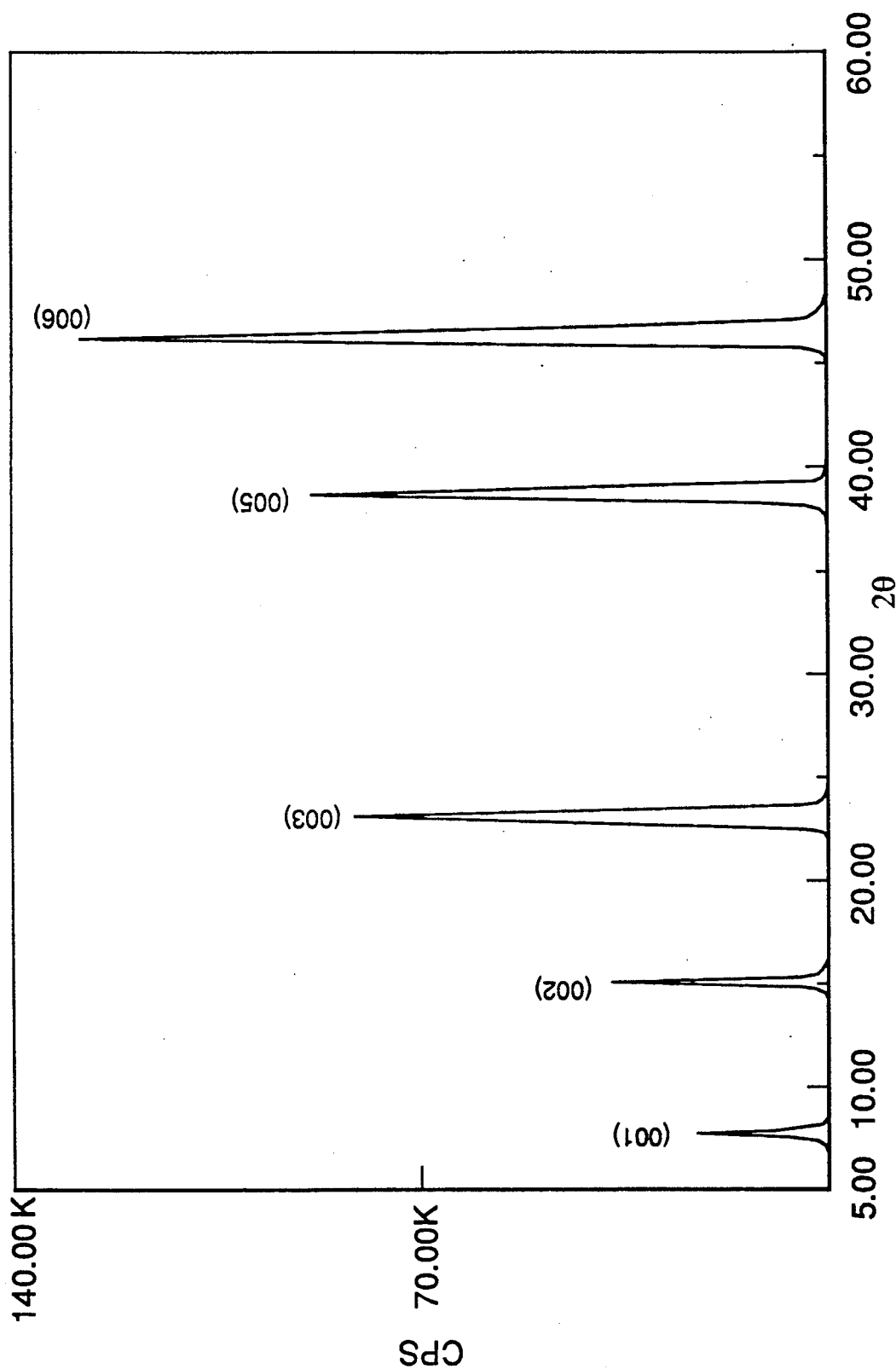
FIG. 3 is a X-ray diffraction chart observed in a superconducting thin film of $Y_1Ba_2Cu_3O_{7-x}$ deposited on a silicon single crystal substrate through a buffer layer of $ZrO_2$ prepared in Example 2 of the present invention.

A superconducting thin film is deposited on the silicon substrates having the buffer layers of Zr$_2$O in a RF sputtering machine by using a powder target which is prepared by sintering a powder mixture of oxides of Y, Ba and Cu (atomic ratio of Y:Ba:Cu=1:2.2:5) under the following conditions:

RF power: 2.4 W/cm$^2$
Distance between target and substrate: 30 mm
Substrate temperature: 700° C.
Sputtering gas: Ar+O$_2$(O$_2$: 20%)
Pressure: $5 \times 10^{-2}$ Torr FIG. 3 is a X-ray diffraction chart observed in the resulting thin film of Sample 1 and shows that the thin film is well-oriented to c-axis. Sample 2 and 3 also show similar X-ray diffraction chart.

The critical temperatures (Tc) of the samples are shown in table 3.

TABLE 3

| Sample | Tc (K) |
|---|---|
| 1 | 87 |
| 2 | 86 |
| 3 | 88 |

EXAMPLE 3

Same sample as sample 3 of the Example 2 is used but the distance between the target and the substrate is changed to values listed in Table 4. The resulting Tc's are also shown in table 4.

TABLE 4

| Distance | Tc (K) |
|---|---|
| 25 mm | 87 |
| 38 mm | 84 |
| 45 mm | 76 |
| 50 mm | 50 |

EXAMPLE 4

Same sample as sample 3 of the Example 2 is used but the PF power applied during the deposition of the superconducting thin film is changed to values listed in Table 5. A thin film obtained at a power density of 6.5 W/cm$^2$ is mere coagulation of granules and is easily pealed off. The resulting Tc's are also shown in table 5.

TABLE 5

| Power density (W/cm$^2$) | Tc (K) |
|---|---|
| 0.4 | 62 |
| 1.1 | 88 |
| 4.2 | 85 |
| 6.5 | 80 |

EXAMPLE 5

A buffer layer of MgO is deposited by sputtering on {100} plane of a silicon substrate under the conditions listed in Table 6.

TABLE 6

| Sample No | substrate temperature | crystalline condition | thickness (Å) |
|---|---|---|---|
| 1 | 200°C. | amorphous | 500 |
| 2 | 500°C. | cubic {100} oriented | 80 |
| 3 | 700°C. | cubic {111} single crystal | 300 |

RF power: 200 W
Pressure: $2 \times 10^{-2}$ Torr

Sputtering gas: Ar+O$_2$ (O$_2$: 20%)

A superconducting thin film is deposited on the silicon substrates having the buffer layers of MgO in a RF sputtering machine by using a powder target which is prepared by sintering a powder mixture of oxides of Y, Ba and Cu (atomic ratio of Y:Ba:Cu=1:2.2:5) under the following conditions:

RF power: 2.4 W/cm$^2$
Distance between target and substrate: 30 mm
Substrate temperature: 700° C.
Sputtering gas: Ar+O$_2$ (O$_2$: 20%)
Pressure: 5×10$^{-2}$ Torr X-ray diffraction charts observed in the resulting thin films of Sample 1 to 3 are same as FIG. 3 in Example 2 and show that the thin film is well-oriented to c-axis.

The critical temperatures (Tc) of the samples are shown in table 7.

TABLE 7

| Sample | Tc (K) |
| --- | --- |
| 1 | 86 |
| 2 | 88 |
| 3 | 87 |

EXAMPLE 6

Same sample as sample 3 of the Example 5 is used but the distance between the target and the substrate is changed to values listed in Table 8. The resulting Tc's are also shown in table 8.

TABLE 8

| Distance | Tc (K) |
| --- | --- |
| 25 mm | 89 |
| 38 mm | 86 |
| 45 mm | 74 |
| 50 mm | 52 |

EXAMPLE 7

Same sample as sample 3 of the Example 5 is used but the PF power applied during the deposition of the superconducting thin film is changed to values listed in Table 9. A thin film obtained at a power density of 6.5 W/cm$^2$ is mere coagulation of granules and is easily pealed off. The resulting Tc's are also shown in table 9.

TABLE 9

| Power density (W/cm$^2$) | Tc (K) |
| --- | --- |
| 0.3 | 64 |
| 1.1 | 89 |
| 4.1 | 84 |
| 6.6 | 81 |

EXAMPLE 8

A buffer layer of a compound film composed of MgO and Ag is deposited by MBE process in which MgO and Ag are evaporated simultaneously onto a silicon substrate under the following conditions:

Substrate temperature: 500° C.
Gas pressure: 1×10$^{-6}$ Torr
Atmosphere: O$_2$ gas
Thickness of thin film: 300 Å

Observation by SEM revealed that crystals of Ag each having particle sizes of 20 to 40 Å are dispersed in a matrix of MgO in a form of islands. The proportion of Ag crystals in the matrix is about 20% in cross sectional area. The fine Ag particles are well-embedded in the matrix of MgO without making an alloy with MgO so that the crystal structure of MgO is not disturbed by the Ag particles. In other words, Ag fine particles are ordered in the MgO matrix.

Then, a superconducting thin film of Y-Ba-Cu-O type compound oxide is deposited on the compound layer composed of MgO and Ag by sputtering under the following conditions:

Atomic ratio in target: Y:Ba:Cu=1:2.2:4.5
RF power: 2.4 W/cm$^2$
Distance between target and substrate: 30 mm
Substrate temperature: 700° C.
Sputtering gas: Ar+O$_2$ (O$_2$: 20%)
Pressure: 5×10$^{-2}$ Torr The superconducting critical temperature (Tc) and the critical current density (Jc) determined by four probe method are as following:

Tc=86K
Jc=1.2×10$^6$ A/cm$^2$ (at 77.3K)

When the thin film obtained is observed by SEM, the surface is very smooth and shows no micro cracks. The thin film of superconducting compound oxide is determined to be a single crystal by electron diffraction analyzer.

EXAMPLE 9

A buffer layer of ZrO$_2$ of 500 Å thick deposited on a silicon (Si) semiconductor substrate by sputtering at a substrate temperature of 650° C.

Three samples are prepared by depositing three superconducting thin film layers of Y-Ba-Cu-O system, Ho-Ba-Cu-O system and Bi-Sr-Ca-Cu-O system on the ZrO$_2$ buffer layer respectively.

Each of the superconducting thin films is deposited by magnetron RF sputtering technique which is itself known. Targets used in the sputtering are prepared by the conventional sintering technique to obtain sintered powder of YBa$_2$Cu$_{4.5}$O$_x$ for Y-Ba-Cu-O system and HoBa$_{2.2}$Cu$_{4.7}$O$_x$ for Ho-Ba-Cu-O system respectively. A target for a superconducting thin film for Bi-Sr-Ca-Cu-O system is prepared by sintering a powder mixture of commercially available Bi$_2$O$_3$ powder, SrCO$_3$ powder, CaCO$_3$ powder and CuO powder (atomic ratio:-Bi:Sr:Ca:Cu=1.4:1:1:1.5). Special attention is paid to the distance between the substrate and the target and to the power of high-frequency, while the silicon substrate is heated at 700° C. during the sputtering operation so that superconducting thin film layers of the respective compound oxides are grown to 1,000 Å on {100} plane of the silicon substrate. For comparison, comparative samples having no buffer layer are prepared by the same condition as above.

The resulting samples of semiconductor substrates having the superconducting thin film layer show good condition at the interface between the semiconductor substrate and the buffer layer and between the buffer layer and the superconducting thin film layer which are required in semiconductor devices. The following table shows the resulting critical temperature Tc (a temperature where the phenomenon of superconductivity start to be observed), Tci (a temperature where zero resistance is observed) and the critical current density determined at 77K of the superconducting thin films of respective samples.

| Superconducting thin film | Critical temperature Tc (K) | Tci (K) | Critical current density (A/cm$^2$) |
| --- | --- | --- | --- |
| $Y_1Ba_2Cu_3O_{7-x}$ | 94 | 90 | $3.0 \times 10^5$ |
| Comparative | 85 | 78 | $0.02 \times 10^5$ |
| $Ho_1Ba_2Cu_3O_{7-x}$ | 92 | 89 | $3.2 \times 10^5$ |
| Comparative | 83 | 79 | $0.03 \times 10^5$ |
| $Bi_4Sr_4Ca_4Cu_6O_{20-x}$ | 106 | 101 | $3.2 \times 10^5$ |
| Comparative | 91 | 80 | $0.02 \times 10^5$ |

EXAMPLE 10

The same operation as Example 9 is repeated except that the semiconductor substrate of silicon is replaced by a single crystal of gallium arsenic (GaAs). In this example, substrate temperature during the sputtering operation is lowered from 650° C. to 300° C. The results are summarized in the following table.

| Superconducting thin film | Critical temperature Tc (K) | Tci (K) | Critical current density (A/cm$^2$) |
| --- | --- | --- | --- |
| $Y_1Ba_2Cu_3O_7-x$ | 95 | 92 | $3.3 \times 10^5$ |
| Comparative | 82 | 79 | $0.02 \times 10^5$ |
| $Ho_1Ba_2Cu_3O_7-x$ | 93 | 90 | $3.1 \times 10^5$ |
| Comparative | 84 | 78 | $0.02 \times 10^5$ |
| $Bi_4SR_4Ca_4Cu_6O_{20-x}$ | 112 | 109 | $3.0 \times 10^5$ |
| Comparative | 90 | 81 | $0.01 \times 10^5$ |

We claim:

1. A semiconductor-superconductor composite consisting of a semiconductor substrate and a thin film of a superconducting material of a compound oxide whose critical temperature is higher than 30K, wherein said thin film is deposited on a buffer layer deposited on a surface of said semiconductor substrate and said buffer is a mixture of particles of Ag and/or Au and at least one oxide selected from the group consisting of $ZrO_2$, MgO, and yttrium stabilized zirconia (YSZ).

2. The composite set forth in claim 1, characterized in that said thin film of superconducting compound oxide is a layer having a c-axis oriented thin film or a single crystal layer.

3. The composite set forth in claim 1, characterized in that said semiconductor substrate is made of a material selected from a group comprising Si, GaAs, GaP, InP, ZnSe, InSb, 3C-SiC, 6H-SiC, InAlAs, GaInAs, InGaAsP, HgCdTe, GaAlAs and CdTe.

4. The composite set forth in claim 1, characterized in that said superconducting thin film layer is composed of a compound oxide of Ba, Ln (in which Ln stands for at least one element selected from a group comprising Y, La and lanthanide elements) and Cu.

5. The composite set forth in claim 4, characterized in that said superconducting thin film layer is composed of a compound oxide represented by the general formula:

$$Ln_1Ba_2Cu_3O_{7-\delta}$$

in which Ln stands for at least one lanthanide element selected from a group comprising La, Nd, Sm, Eu, Gd, Dy, Ho, Y, Er, Yb, Tm and Lu and $\delta$ is a number which satisifies a range of $0 \leq \delta < 1$.

6. The composite set forth in claim 1, characterized in that said superconducting thin film layer is composed mainly of a compound oxide represented by the general formula:

$$\Theta_4(\Phi_{1-q}, Ca_q)_m Cu_n O_{p+r}$$

in which $\Theta$ stands for Bi or Tl, $\Phi$ stands for Sr when $\Theta$ is Bi and stands for Ba when $\Theta$ is Tl, m and n are numbers each satisfying ranges of $6 \leq m \leq 10$ and $4 \leq n \leq 8$ respectively, $p = (12 + 2m + 2n)/2$, q is a number which satisfies a range of $0 < q < 1$, and r is a number which satisifies a range of $-2 \leq r \leq +2$.

* * * * *